United States Patent [19]

Satake et al.

[11] 4,263,545

[45] Apr. 21, 1981

[54] METHOD OF TESTING PULSE DELAY TIME

[75] Inventors: Shozo Satake, Hadano; Katsuhiko Takizawa, Machida, both of Japan

[73] Assignee: Hitachi, Ltd., Tokyo, Japan

[21] Appl. No.: 37,888

[22] Filed: May 10, 1979

[30] Foreign Application Priority Data

May 17, 1978 [JP] Japan .................................. 53-57664

[51] Int. Cl.³ .......................................... G01R 27/00
[52] U.S. Cl. .............................. 324/57 PS; 307/269; 328/131; 324/57 DE; 368/107
[58] Field of Search ............ 324/57 PS, 57 DE, 57 R, 324/102; 307/269; 328/129, 131; 368/107

[56] References Cited

U.S. PATENT DOCUMENTS

| | | | |
|---|---|---|---|
| 2,337,540 | 12/1943 | Burgess | 324/57 DE |
| 2,746,013 | 5/1956 | Mertz | 324/57 DE |
| 2,889,515 | 6/1959 | Murphy | 324/57 PS |
| 2,915,700 | 12/1959 | Cartwright | 324/57 PS |
| 3,505,593 | 4/1970 | Gram et al. | 324/57 R |
| 4,168,526 | 9/1979 | Auer, Jr. et al. | 328/129 X |

OTHER PUBLICATIONS

Deckert, Circuit Response Time Tester, IBM Technical Disclosure Bulletin, Apr. 1972, p. 3330.

*Primary Examiner*—Stanley T. Krawczewicz
*Attorney, Agent, or Firm*—Craig and Antonelli

[57] ABSTRACT

An AC test is disclosed which measures a time from the application of an input pulse on an input terminal of a circuit under consideration to the appearance of an output pulse on an output terminal of the circuit. The input terminal of the circuit is connected with an input driver through a first relay and connected with a pulse generator through a second relay. The opening-closing sequence of the first and second relays is selected such that the input terminal of the circuit is connected with at least one of the pulse generator and the input driver during a status setting of the circuit and during the application of the pulse. As a result, the occurrence of noises at the time of change-over operation between the pulse generator and the input driver is suppressed.

8 Claims, 3 Drawing Figures

METHOD OF TESTING PULSE DELAY TIME

BACKGROUND OF THE INVENTION

The present invention relates to a method of testing pulse delay times in circuits to be checked, especially semiconductor integrated circuits (hereinafter referred to as ICs).

In a recent IC technology, the increasing degree of integration has been demanded with a large number of pins and high operation speed required. When any defect is located in such highly integrated ICs after the mounting thereof on a system, it is very difficult to detect one of the ICs having a certain fault and the kind of that fault. Accordingly, a sufficient test is required in the state of a single IC in order to improve a yield in the succeeding steps.

Test modes for a single IC include a function test, a DC test and an AC test. In the function test, the logical function of IC is checked. In the DC test, the source current, input leakage current, output voltage and output current of IC are checked in order to determine whether they fall within standards or not. The AC test measures a delay time in IC, i.e. a time from an instant at which an input pulse is applied to an input pin of the IC to an instant at which an output pulse is delivered at an output pin thereof.

Among these test modes, the AC test has a problem resulting from the increased integration and operation speed of IC. When one IC consists of only logical gates such as AND gates or OR gates or consists of only flip-flops, the AC test encounters no special problem. With the increased integration of IC, however, an IC has been developed which incorporates the combination of gates and flip-flops, especially two or more stages of flip-flops. For such an IC, the mere application of an input pulse does not sometimes result in the delivery of an output. Namely, a status setting is required to the associated flip-flop when the pulse passes through the IC. Thus, the status setting is required for the measurement of a pulse delay time in IC and any entrance of noises into an input signal pin is not acceptable during a period from the status setting to the completion of delay time measurement. If noises enter the input signal pin, the value of the set status may change. Similarly, when after a first test of delay time measurement for a certain path a second test is desired for another path, the entrance of noises into the input signal pin must be avoided in order to save a test time and a status setting time while keeping the previous status setting.

An input pin of a circuit to be checked is connected through switching elements with an input driver which delivers a predetermined level of voltage for the status setting and with a pulse generator which generates pulses. The switching element may be an electronic switch such as a transistor or a relay. However, in the case where the transistor is used, its characteristic and performance must be carefully selected and a highly accurate test is impossible because of its action of deteriorating the pulses from the pulse generator or making the sharpness of the pulse waveforms weak. These problems may be eliminated in the case where the relay is used as the switching element. A test system using relays as the switching elements is known in "S157 PULSE PARAMETER TEST SYSTEM Maintenance Manual" pp. 9.1.1–9.2.3 published by TERADYNE, Inc. However, even when the relays are used as the switching elements, the entrance of noises may not be avoided depending upon the opening-closing sequence of the relays.

SUMMARY OF THE INVENTION

An object of the present invention is to provide a pulse delay time testing method in which the delay time can be measured with high accuracy.

Another object of the present invention is to provide a method of testing a pulse delay time by means of a test system using a relay as a switching element.

According to the present invention, an input terminal of a circuit to be checked or under consideration (for example, an input pin of an IC) is connected with an input driver through a first relay on one hand and connected with a pulse generator through a second relay on the other hand. In the operation of test, the first relay is first closed so that the input terminal of the circuit under consideration is connected with the input driver and an input to the circuit under consideration is set to a predetermined ("high" or "low") voltage level by means of the output of the input driver. Next, the level of an output voltage of the pulse generator is set to the same as that of the input driver and the second relay is closed so that the input terminal of the circuit under consideration is connected with the pulse generator. Thereafter, the first relay is opened to disconnect the input driver from the circuit under consideration. The input level of the circuit under consideration is the same both when the second relay is closed and when the first delay is closed. Therefore, the set status of the circuit under consideration is not adversely affected by the opening-closing operation of the relays. Under such circumstances, a pulse from the pulse generator is supplied to the circuit under consideration to effect an AC test.

In the present invention, the relays are used in such a manner that the input of the circuit under consideration is always connected with the pulse generator or the input driver. Therefore, the occurrence of noises which otherwise may appear at the time of the change-over operation between the pulse generator and the input driver, etc. can be suppressed, thereby permitting a test with high accuracy.

DESCRIPTION OF THE PREFERRED EMBODIMENTS

For the purpose of easy understanding of the present invention, the principle of an AC test necessitating a status setting will be explained with the aid of FIG. 1.

Figure 1:
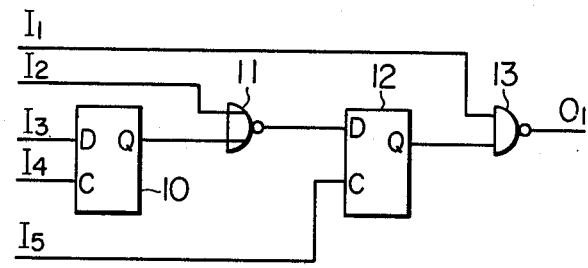
FIG. 1 is a circuit diagram of the internal circuit of an exemplary IC useful in explaining the principle of an AC test involving a status setting.

FIG. 1 shows a circuit diagram of the internal circuit of an exemplary simple IC. The shown IC includes two D-type flip-flops 10 and 12, a NOR gate 11 and a NAND gate 13. In operation of the D-type flip-flop, a voltage with a high/low level has been inputted in its data input D and the value inputted in the data input D is delivered only when a clock is applied to a clock input C. In the case where a new clock is not applied, the flip-flop delivers the value of data which has been inputted when the preceding clock was applied.

When it is desired to measure a delay time from the application of a pulse on a clock input $I_5$ of the flip-flop 12 to the appearance of the clock on an output terminal $O_1$, it is necessary that a high level is established on the D input of the flip-flop 12 if the status of the flip-flop 12 is in a low level. For that purpose, an input $I_3$ or the D input of the flip-flop 10 is set to the low level and an input $I_4$ or the C input of the flip-flop 10 is thereafter changed from the low level to the high level, thereby rendering the output of the flip-flop 10 low. At this time, if an input $I_2$ with the low level is applied, the NOR gate 11 delivers a high level output to the D input of the flip-flop 12. During this setting, the clock input $I_5$ of the flip-flop 12 has the low level. Then, if an input $I_1$ is set to the high level, an output pulse appears on the output terminal $O_1$ when an input pulse is applied to the input $I_5$. Thus, in a logic circuit including flip-flops, a status setting is required for the measurement of delay time.

Though the input $I_5$ initially has a low DC level, a pulse generator must be connected with the input $I_5$ at the time of delay time measurement. If noises are imparted on the input $I_5$ upon change-over from the DC level to the pulse generator, the high level preliminarily set to the D input of the flip-flop 12 would be latched into the same flip-flop. Accordingly, the measurement of delay time must be made through the application of a pulse to the clock input $I_5$ of the flip-flop 12 after the input $I_5$ is connected with the pulse generator in such a manner that any noises are not imparted on the input $I_5$.

Figure 2:
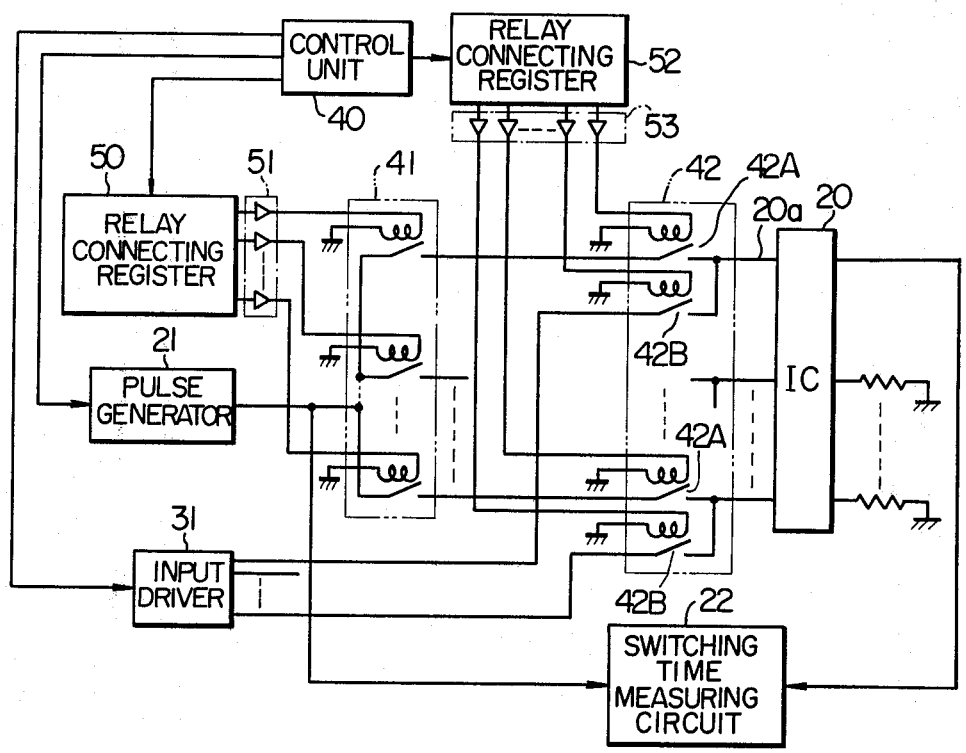
FIG. 2 shows in block diagram an example of the test system used in the present invention.

An embodiment of the present invention will be now explained referring to FIG. 2.

In FIG. 2, a matrix 42 of selection relays is connected with input pins of an IC 20 which is exemplified as a circuit to be checked or under consideration. The selection relay matrix 42 includes a pair of relays 42A and 42B for each input pin of the IC 20. The relays 42A and 42B are driven through a relay driving circuit 53 by a relay connecting register circuit 52. The relays 42B are connected with output terminals of an input driver 31 respectively. On the other hand, the relays 42A are connected with respective relays of a distribution relay matrix 41. The relays of the distribution relay matrix 41 are driven through a relay driving circuit 51 by a relay connecting register circuit 50. All the relays in the distribution relay matrix 41 are commonly connected with a pulse generator 21. A control unit 40 is provided for controlling the input driver 31, the pulse generator 21 and the relay connecting circuits 50 and 52. The control unit may be, for example, a small-size computer.

A waiting time of a predetermined period is required for the relay circuit since noises such as chattering occur thereon after a selected relay is closed or enabled (for example, by latching data of "1" into the relay connecting register circuit 50). Such a waiting time of about 2 ms is necessary for presently available relays. Similarly, the provision of a waiting time of a predetermined period is preferable after the relay is opened or disabled (for example, by latching data of "0" into the relay connecting register circuit 50). Thus, the opening-closing operation of relays at any sequence requires that a predetermined waiting time is provided to drive one relay after data has been latched into a corresponding relay connecting register and that data is thereafter latched into a relay connecting register associated with the next relay.

For a status setting to the IC 20, all the relays 42A in the selection relay matrix 42 are opened while all the relays 42B are closed, so that the input pins of the IC 20 are connected with the respective output terminals of the input driver 31. As previously described, the status setting is an operation for determining a gate in the internal circuit of the IC through which a pulse passes. The pulse passing gate is determined by setting to a predetermined high/low level each of the respective output voltages of the input driver 31 corresponding to the input pins of the IC 20. Next, the connection between the IC 20 and the pulse generator 21 through the selection relays 42A is made in order to apply an input pulse from the pulse generator 21 to one input pin (for example 20a) of the IC 20. This is carried out at the following sequence. Namely, the output level of the pulse generator 21 is set to be the same as the high/low level at the output terminal of the input driver 31 corresponding to the IC input pin 20a to which the input pulse is to be applied. Thereafter, one of the relays in the distribution relay matrix 41 corresponding to the IC input pin 20a is closed. At this point of time, the output level of the pulse generator 21 is supplied to the relay 42A in the selection relay matrix 42 corresponding to the IC input pin 20a. Next, the corresponding relay 42A is closed. Thus, the output level of the pulse generator 21 and the output level of the input driver 31 are supplied to the IC input pin 20a. Finally, one of the relays 42B in the selection relay matrix 42 corresponding to the IC input pin 20a is opened or disconnected from the IC 20. At this point of time, the pulse input pin 20a of the IC 20 is now connected with only the pulse generator 21.

For an AC test, the pulse generator 21 generates a high-low-high pulse signal when the initially set output level of the generator 21 is high and a low-high-low pulse signal when the initially set generator output level is low. With the generation of the pulse, a pulse delay time in the IC 20 is measured by a switching time measuring circuit 22 in a well-known manner.

The disconnection of the pulse generator 21 from the pulse input pin 20a of the IC 20 is carried out in such a manner that the relay 42B in the selection relay matrix 42 corresponding to the IC input pin 20a is first closed, the relay 42B in the selection relay matrix 42 corresponding to the IC input pin 20a is thereafter opened and finally the relay in the distribution relay matrix 41 corresponding to the IC input pin 20a is opened.

FIG. 2, the distribution relay matrix 41 may be omitted. In that case, the relays 42A in the selection relay matrix 42 are commonly connected with the pulse generator 21 directly.

As described above, the change-over operation between the pulse generator and the input driver free from the change in status of a circuit element such as a flip-flop necessitating its status setting is possible by establishing the same level between the output of the pulse generator and the output of the input driver and providing a predetermined sequence to the connection (closing) and disconnection (opening) operation of relays so that the IC input pin is always connected with the pulse generator or the input driver. Thus, an AC test is possible with high accuracy.

When the number of IC input pins is large, the test system shown in FIG. 2 would have an increased capacitive load due to the wiring for the distribution relay matrix 41, which results in the deterioration or weak sharpness of pulse waveform and the lowering of the accuracy of AC test. Namely, the distribution relay matrix 41 is provided with relays identical in number to or larger in number than the input pins of the IC 20 to couple a signal from the pulse generator 21 with any input pin of the IC 20 and the wiring is provided from the pulse generator 21 to such many relays, thereby increasing the capacitive load.

Figure 3:
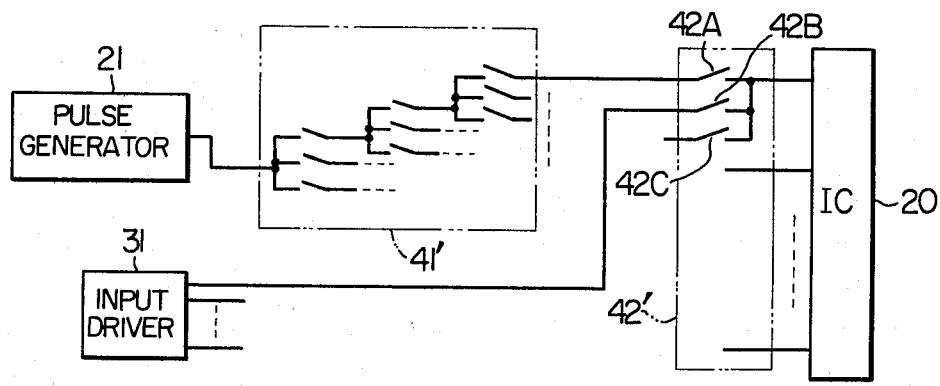
FIG. 3 shows in block diagram another example of the test system used in the present invention.

The problem of increased capacitive load can be solved by a system shown in FIG. 3. Referring to FIG. 3, relays of a distribution relay matrix 41' are arranged in a tree-like connection. With such an arrangement, a capacitive load resulting from the wiring for the relays can be reduced so that a relatively sharp waveform is available.

In addition to the relays 42A and 42B respectively connected with the pulse generator 21 and the input driver 31, a selection relay matrix 42' shown in FIG. 3 includes a relay 42C capable of being connected with the other device, for example, a DC measuring device. Such a relay 42C may be provided in the system of FIG. 2, too. Without limiting to the shown group of three relays 42A, 42B and 42C, one relay group can be formed by a further increased number of relays.

In FIG. 3, the control section 40, the switching time measuring circuit 22, the relay connecting register circuits 50 and 52, etc. are omitted from the illustration.

From the herein disclosed opening-closing sequence of relays, various concrete constructions of the control section 40 for performing that sequence will be obvious to those skilled in the art. Since the control section 40, the relay connecting register circuits 50, 52 and the switching time measuring circuit 22 can be constructed by well-known conventional circuit components, further explanation is omitted.

In FIG. 2, it is seen that the IC 20 has one output pin which relates to the input pin 20a and is connected with the switching time measuring circuit 22 and the remaining output pins each of which has a grounded register. The shown connection corresponds to the measurement for the input pin 20a. It should be understood that when measurement is made with respect to the other input pin, the output pin related thereto is connected with the circuit 22 and the other output pins are disconnected from the circuit 22. For that purpose, each of the output pins may have two paths, i.e. one connected through a first relay with the circuit 22 and the other connected through a second relay with a grounded resistor, and the first and second relays may be driven through a suitable relay connecting register circuit by the control unit 40.

We claim:

1. A method of measuring a time from an instant at which an input pulse from a pulse generator is applied to an input terminal of a circuit under consideration to an instant at which an output pulse appears on an output terminal of said circuit under consideration, said input terminal of said circuit under consideration being connected with an input driver through a first relay on one hand and connected with said pulse generator through a second relay on the other hand, the method comprising the sequential combination of:

a first step of closing said first relay to apply a first voltage of a predetermined level to said input terminal by said input driver;

a second step of closing said second relay to apply a second voltage of the same level as said predetermined level of said input driver to said input terminal by said pulse generator;

a third step of opening said first relay;

a fourth step of applying an input pulse from said pulse generator to said input terminal; and a fifth step of measuring a time from the application of the input pulse on said input terminal to the appearance of an output pulse on said output terminal.

2. A method according to claim 1, further comprising after said fifth step a sixth step of closing said first relay and a seventh step of thereafter opening said second relay.

3. A method according to claim 1 or 2, wherein said first step includes a first phase of closing said first relay and a second phase of applying said first voltage to said input terminal by said input driver.

4. A method according to claim 1 or 2, wherein said second step includes a first phase of setting the output of said pulse generator to said second voltage of the same level as said predetermined level of said input driver and a second phase of thereafter closing said second relay.

5. A method of measuring a time from an instant at which an input pulse from a pulse generator is applied to a predetermined one of plural input pins of a circuit under consideration to an instant at which an output pulse appears on an output terminal of said circuit under consideration, said plural input terminals of said circuit under consideration being connected with an input driver through a plurality of first relays respectively on one hand and connected commonly with said pulse generator through a plurality of second relays respectively, the method comprising the sequential combination of:

a first step of closing all of said first relays to apply a first voltage of a predetermined level to each of said plural input terminals by said input driver;

a second step of closing one of said second relays connected with said predetermined input terminal to apply a second voltage of the same level as said predetermined level of said input driver to said predetermined input terminal by said pulse generator;

a third step of opening one of said first relays connected with said predetermined input terminal;

a fourth step of applying an input pulse from said pulse generator to said predetermined input terminal; and a fifth step of measuring a time from the application of the input pulse on said predetermined input terminal to the appearance of an output pulse on said output terminal.

6. A method according to claim 5, further comprising after said fifth step a sixth step of closing said one first relay opened at said third step and a seventh step of thereafter opening said one second relay closed at said second step.

7. A method according to claim 5 or 6, wherein said first step includes a first phase of closing all of said first relays and a second phase of applying said first voltage to each of said plural input terminals by said input driver.

8. A method according to claim 5 or 6, wherein said second step includes a first phase of setting the output of said pulse generator to said second voltage of the same level as said predetermined level of said input driver and a second phase of closing said one second relay connected with said predetermined input terminal.

* * * * *